United States Patent
Joo

(10) Patent No.: US 6,504,765 B1
(45) Date of Patent: Jan. 7, 2003

(54) FLASH MEMORY DEVICE AND METHOD OF ERASING THE SAME

(75) Inventor: Seok Jin Joo, Kyungki-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/026,940

(22) Filed: Dec. 27, 2001

(30) Foreign Application Priority Data

Nov. 19, 2001 (KR) .......................................... 2001-71715

(51) Int. Cl.[7] .............................................. G11C 16/04
(52) U.S. Cl. ............................ 365/185.29; 365/185.26; 365/149
(58) Field of Search ........................ 365/185.29, 185.33, 365/185.26, 185.01, 185.16, 185.25, 149

(56) References Cited

U.S. PATENT DOCUMENTS

| | | | | |
|---|---|---|---|---|
| 5,764,572 A | * | 6/1998 | Hammick | 365/185.33 |
| 5,898,619 A | * | 4/1999 | Chang et al. | 365/185.23 |
| 6,292,400 B1 | * | 9/2001 | Dozza et al. | 365/185.25 |

* cited by examiner

*Primary Examiner*—David Nelms
*Assistant Examiner*—Thong Le
(74) *Attorney, Agent, or Firm*—Morgan, Lewis & Bockius LLP

(57) ABSTRACT

The present invention relates to a flash memory device. The present invention relates to a flash memory device in which a capacitor of a given capacitance is connected between a bit line connected to a drain region and a ground line within a flash cell array, and method of erasing the same. Therefore, the present invention can reduce the time and power consumption in the cell erase operation, by accelerating an increase of hot carriers generated in a diode reverse-bias state between the drain region and a semiconductor substrate upon an erase operation of the cell to prevent over-erase or non-erase of the cell by means of hot carriers and by thus solving an over-erase problem of the cell without requiring additional pre-programming and verification operation and additional post-programming and verification operation.

9 Claims, 6 Drawing Sheets

FLASH MEMORY DEVICE AND METHOD OF ERASING THE SAME

BACKGROUND OF THE INVENTION

1. Field of the Invention

The invention relates generally to a flash memory device and method of erasing the same, and more particularly to, a flash memory device in which a capacitor of a given capacitance is connected between a bit line connected to a drain region and a ground line within a flash cell array, and method of erasing the same. Therefore, the present invention can accelerate an increase of hot carriers generated in a diode reverse-bias state between the drain region and a semiconductor substrate upon an erase operation of the cell to prevent over-erase or non-erase of the cell by means of hot carriers and thus solve an over-erase problem of the cell without requiring additional pre-programming and verification operation, and additional post-programming and verification operation, thus reducing the time and power consumption in the cell erase operation.

2. Description of the Prior Art

The type of semiconductor memory devices is mainly classified into RAM (Random Access Memory) products such as DRAM (Dynamic Random Access Memory) and SRAM (Static Random Access Memory), and ROM (Read Only Memory). RAM is volatile since the data in RAM is lost in time but ROM is nonvolatile since the data in ROM is not lost. Also, the input/output speed of data in RAM is fast but the input/output speed of data in ROM is low. The ROM products include ROM, PROM (Programmable ROM), EPROM (Erasable Programmable ROM) and EEPROM (Electrically Erasable Programmable ROM). Of the ROM products, there is a trend that a demand for EEPROM into/from which data can electrically programmed and erased is increased. The EEPROM or a flash EEPROM having a batch erase function has a stack type gate structure in which a floating gate electrode and a control gate electrode are stacked.

The flash memory cell has been widely used in portable electronics such as notebooks, PDAs, cellular phones and the like, and computer BIOS and printer or the like. In view of a circuit, the type of the flash memory cell is classified into a NAND type suitable for higher integration and a NOR type suitable for high-speed operation. In the NAND type flash memory cell, n number of cell transistors is serially connected to form a string and a plurality of strings are in parallel connected between bit lines and ground lines. On the other hands, in the NOR type flash memory cell, respective cell transistors are in parallel connected between bit lines and the ground lines.

The structure and operation of a basic NOR type flash memory cell will be below described by reference to FIGS. 1 and 2. FIG. 1 is an equivalent circuit diagram of a conventional flash memory cell array, and FIG. 2 is a vertical cross-sectional view of the memory cell shown in FIG. 1.

Referring now to FIG. 1, a plurality of memory cells MC are connected between a plurality of word lines W/L and a plurality of bit lines B/L, which are orthogonal one another. A source region of each of the memory cells MC is connected to a common source line CSL.

A structure of the memory cells MC will be below described by reference to FIG. 2. A tunnel oxide film 11 of 100 Å in thickness is formed between a floating gate 12 and a semiconductor substrate 10. An interlayer dielectric film 13 of an oxide/nitride/oxide (ONO) structure having a high dielectric constant is formed between the floating gate 12 and a control gate 14 serving as the word lines W/L. In addition, source and drain regions 15 and 16 are formed to be self-aligned with the stack gate.

The NOR type flash memory cell performs a program operation using a channel hot electron (CHE) injection method and performs an erase operation using the F-N (Fowler-Nordheim) tunneling effect through a source or a bulk substrate.

First, the programming operation is one to store electrons in the floating gate 12 to increase the threshold voltage $V_{th}$ of the cell MC from a voltage of around 2V being an initial $V_{th}$ value to a voltage of about 7V. In other words, if a voltage of 5~7V is applied to a selected bit line B/L and a voltage of 9~12V is applied to a selected word line W/L used as the control gate 14 and a voltage of 0V is applied to the common source line CSL and the semiconductor substrate 10, some of the channel hot electrons is implanted into the floating gate 12 through the tunnel oxide film 11 by means of a gate electric field, so that a programming operation can be performed.

The erase operation is one to discharge electrons of the floating gate 12 to lower the threshold voltage $V_{th}$ of the cell MC to a voltage of around 2V being an initial $V_{th}$ value. In other words, if a selected bit line W/L is floated, a voltage of 12V~15V is applied to the common source line CSL, a negative voltage of −8V is applied to the word lines W/L used as the control gate 14 and a positive voltage of 8V is applied to the semiconductor substrate 10, electrons within the floating gate 12 are discharged into the source region 15 by means of the difference in the voltage between the floating gate 12 and the source region 15 in the F-N tunneling effect through the tunnel oxide film 11 of about 100 Å, so that an erase operation can be performed.

The erase operation adopts a batch block erase mode by which several hundreds~several thousands of bits including a plurality of the word lines W/L and bit lines B/L are processed in a single block.

A reading operation detects whether a current path is generated through erase and program cells by applying a voltage of around 1V to a selected bit line B/L and a voltage of 4~5V to the word line W/L. The NOR-type the flash memory cell having this structure, however, has a disturbance phenomenon by means of over-erase. Over-erase means a phenomenon that an erase threshold voltage is lowered to 0V since a tunneling electric field is changed due to process defect in the unit cell, deterioration of the tunnel oxide film, oxidization of a tunnel edge and the like, while the threshold voltage of a normal erase cell is 2V. Generally, upon a programming operation, a selected cell must be programmed by generation of current through only the selected cell connected to a selected bit line to which programming voltage of 6V is applied and a selected word line to which a voltage of 12V is applied. If there is an over-erased cell in a non-selected word line to which a voltage of 0V is applied, however, the amount of current through a selected cell is reduced since a bit line voltage is discharged through a non-selected cell due to the threshold voltage of 0V. Due to this, there is a problem that the selected cell is not programmed since generation of hot electrons necessary for programming is prohibited. Further, upon a reading operation, there is a problem that a flow of current through an over-erased cell erroneously reads the selected cell as an erase state even when the selected is at a programming state due to abnormal current path through a non-selected over-erased cell.

In order to prevent over-erase of the cell as above, a conventional flash cell performs a pre-programming operation in order to match the threshold voltage of an initial cell to a certain degree and performs a post-programming operation being a soft program process in order to remove over-erased cell even after the erase operation is completed. This method, however, additionally requires a pre-programming S31 and a pre-programming verification S32, which are continued until the programming state is verified, and a post-programming S35 and a post-programming verification S36, which are continued until an over-erased cell is removed, as shown in FIG. 3 in addition to erase and erase verification algorithm. Therefore, this method degrades time efficiency in the cell erase operation. In addition, as current rarely flows in the F-N tunneling mode used upon an erase of the flash cell S33, the actually consumed power is not great. However, as current of over 200 μA per single cell flows in the pre-programming S31 and current of over 200 μA per bit line B/L flows in the pre-programming S35, the actually consumed power is increased within the algorithms S31 and S35 for preventing over-eras not the erase S33. Further, a conventional erase algorithm requires additional peripheral circuit for the post-programming and must simultaneously drive a positive charge pump circuit as well as a negative charge pump circuit, upon an erase operation. Therefore, the conventional erase algorithm consumes a lot of power since additional current is generated in the peripheral circuit block driven by an internal clock.

SUMMARY OF THE INVENTION

The present invention is contrived to solve the above problems and an object of the present invention is to provide a flash memory device in which a capacitor of a given capacitance is connected between a bit line connected to a drain region and a ground line within a flash cell array, and method of erasing the same, capable of reducing the time and power consumption in the cell erase operation by accelerating an increase of hot carriers generated in a diode reverse-bias state between the drain region and a semiconductor substrate upon an erase operation of the cell to solve over-erase or non-erase of the cell.

In order to accomplish the above object, a flash memory device according to the present invention is characterized in that it a memory cell array in which a plurality of memory cells are each connected between a plurality of word lines and a plurality of bit lines, a plurality of switching means each connected to said bit lines, and a capacitor connected between the plurality of the switching means and grounds.

Further, a flash memory device having a memory cell array in which a plurality of memory cell are connected between a plurality of word lines and a plurality of bit lines, respectively, is characterized in that upon an erase operation of the memory cell, a capacitor is connected between the plurality of the bit lines and grounds in order to prevent over-erase and non-erase.

Further, a method of erasing a flash memory cell including a floating gate and a control gate stacked on a semiconductor substrate, and source and drain formed in the semiconductor substrate on both sides of a floating gate is characterized in that it comprises performing an erase operation as electrons injected into the floating gate are discharged through the semiconductor substrate, by applying respective erase bias voltages to the control gate, the source and drain, and the semiconductor substrate, wherein hot carriers are generated in the semiconductor substrate depending on an increase of current by a capacitance between the drain and the ground and the generated hot carriers are injected into the floating gate, thus preventing over-erase and non-erase.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
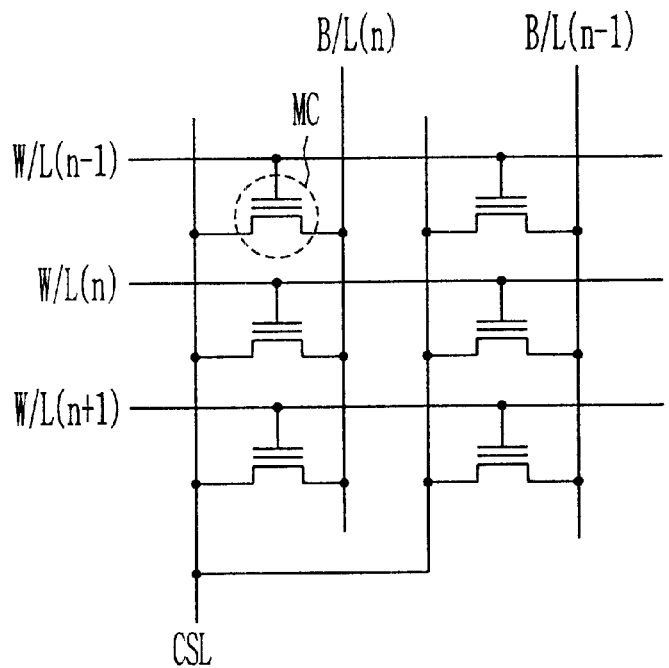
FIG. 1 is an equivalent circuit diagram of a conventional flash memory cell array.
Figure 2:
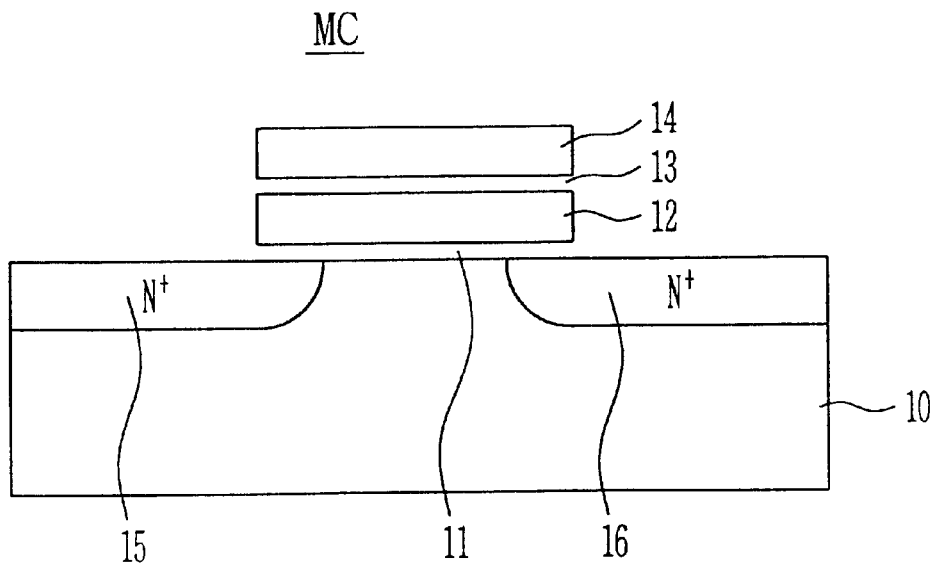
FIG. 2 is a vertical cross-sectional view of the memory cell shown in FIG. 1.
Figure 3:
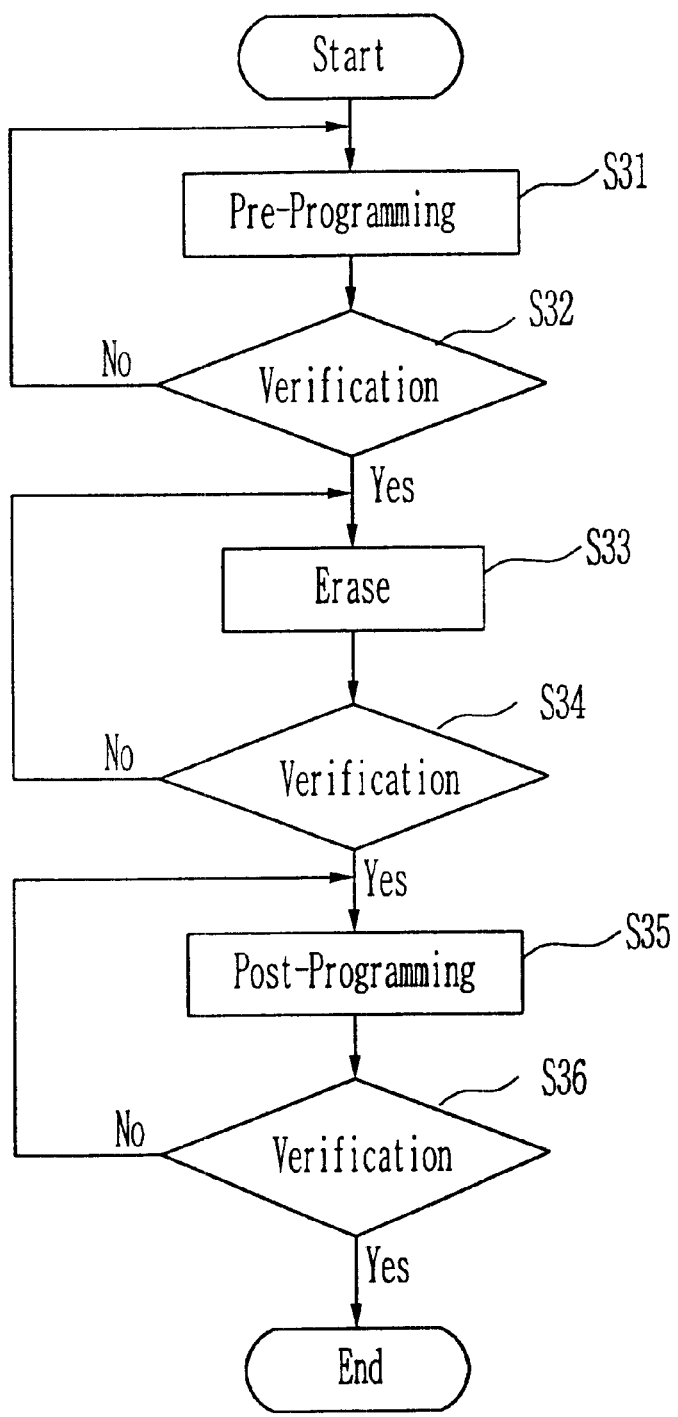
FIG. 3 is an erase flowchart of a conventional flash memory cell.

The present invention will be described in detail by way of a preferred embodiment with reference to accompanying drawings, in which like reference numerals are used to identify the same or similar parts.

Figure 4:
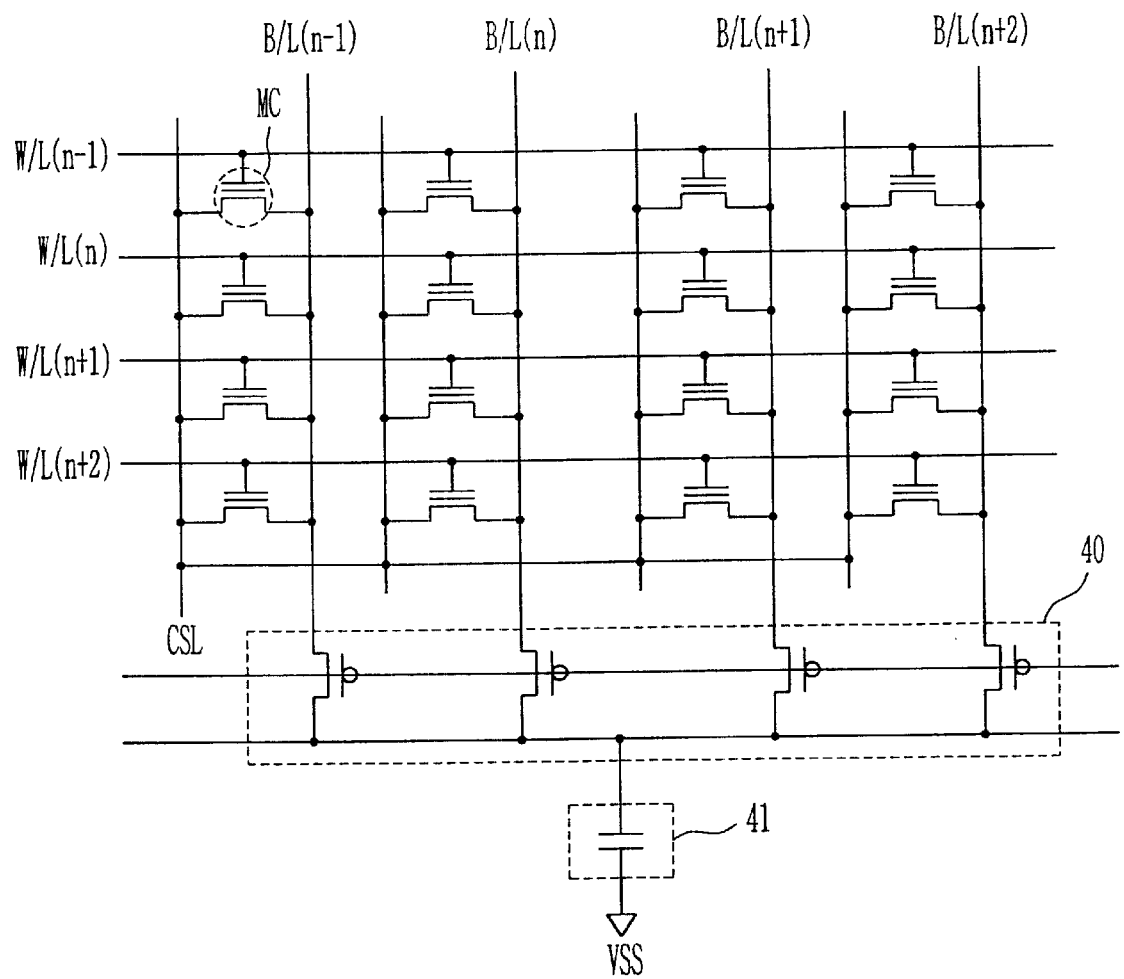
FIG. 4 is an equivalent circuit diagram of a flash memory cell array according to one embodiment of the present invention.
Figure 5:
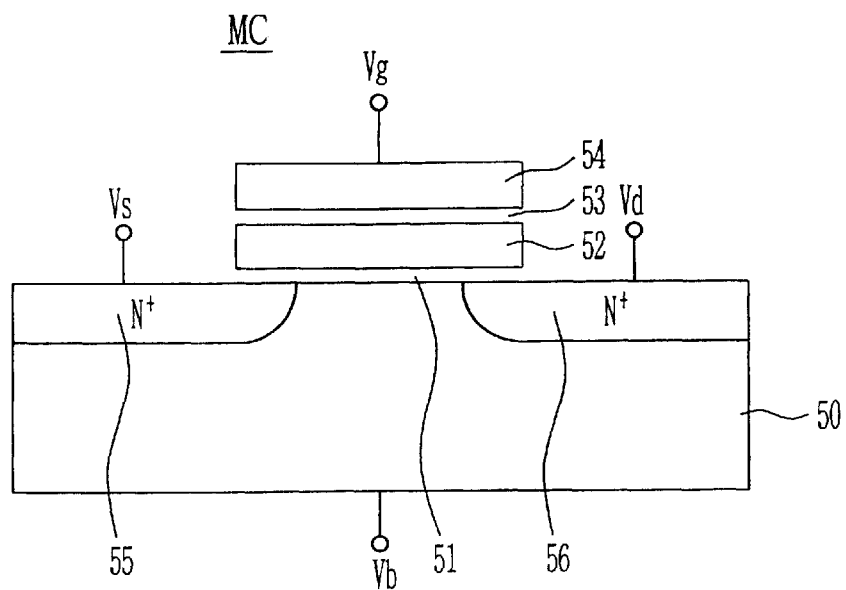
FIG. 5 is a vertical cross-sectional view of the memory cell shown in FIG. 4.
Figure 6:
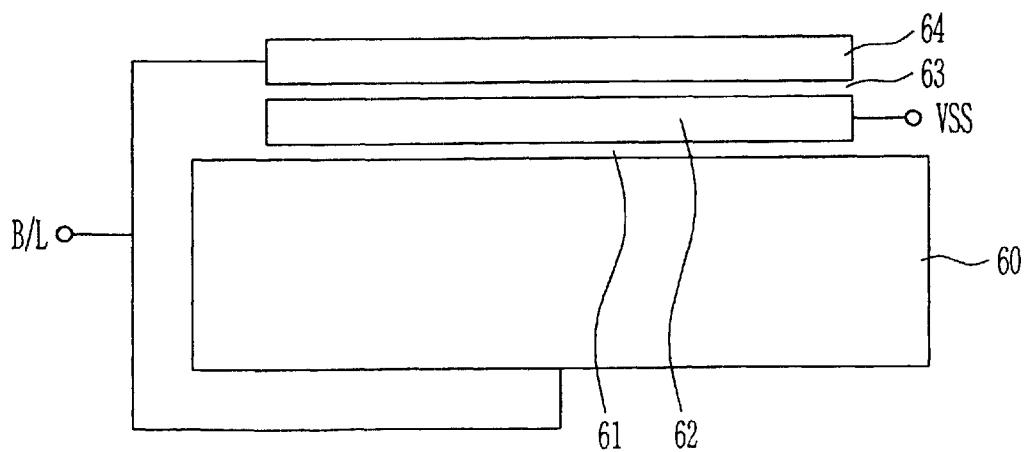
FIG. 6 is a vertical cross-sectional view of the capacitor shown in FIG. 4.

FIG. 4 is an equivalent circuit diagram of a flash memory cell array according to one embodiment of the present invention, FIG. 5 is a vertical cross-sectional view of the memory cell shown in FIG. 4, and FIG. 6 is a vertical cross-sectional view of the capacitor shown in FIG. 4.

Referring now to FIG. 4, a flash memory cell array of the present invention includes a plurality of word lines W/L and a plurality of bit lines B/L, which are orthogonal one another, a plurality of memory cells MC connected between the plurality of the word lines W/L and the plurality of the bit lines B/L, a plurality of switching means 40 each connected to the bit lines B/L, and a capacitor 41 connected between the plurality of the switching means 40 and a ground Vss. Also, the flash memory cell array further includes a common source line CSL connected to a source region of each of the memory cells MC.

The memory cell MC may have a stack structure type cell that includes a tunnel oxide film 51 formed on a semiconductor substrate 50, a floating gate 52 for storing information, a control gate 54 for programming and erasing information, an interlayer dielectric film 53 formed between the floating gate 52 and the control gate 54, a source region 55 connected to the common source line CSL, and a drain region 56 connected to the bit line B/L, or a split structure type cell that includes a gate (not shown) consisting of a select gate for selecting the word lines W/L, control gates connected to the word lines W/L, for programming and erasing information and a floating gate for storing information, a source region connected to the source line CSL, and a drain region connected to the bit line B/L, as shown in FIG. 5.

The switching means 40 may includes a switching element consisting of a general PMOS transistor or a switching element capable of switching among semiconductor devices, as a high voltage of 8V on the bulk side must be transmitted to the capacitor 41. The switching elements is connected to one of the power supply terminal Vcc, a ground terminal Vss and an output terminal of external driving circuit or alternately connected by given switches, and is driven by an output signal from the terminals. In other words, the switching means 40 is controlled by the output signal to shot or open a connection between the bit line B/L and the capacitor 41.

The capacitor 41 may be used by additionally forming a general capacitor in the cell array or may be formed using a dummy cell not used as a memory cell MC in order to reduce an array area of the flash memory cell. If the capacitor 41 is additionally formed in the cell array, the capacitor 41 can be formed using the same process to the unit cell MC. For example, as shown in FIG. 6, the capacitor 41 includes a tunnel oxide film 61 formed on a semiconductor substrate 60, and a stack type gate having a floating gate 62, an interlayer dielectric film 63 and a control gate 64 on the tunnel oxide film 61.

As such, the stack type gate for implementing the capacitor 41 may be simultaneously formed by the same manufacturing process to that of forming the unit cell MC. The floating gate 62 is connected to the ground Vss and maintains its ground state. The control gate 64 and the semiconductor substrate 60 are connected to the bit line B/L and the tunnel oxide film 61 and the interlayer dielectric film 63 are connected in parallel, thus forming a capacitor structure.

Figure 7:
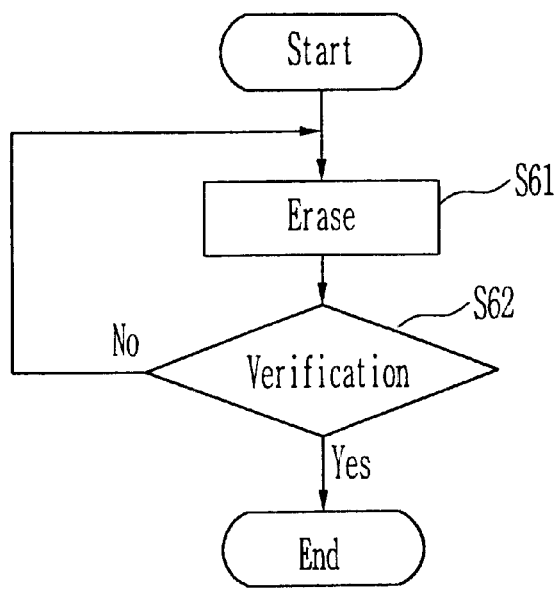
FIG. 7 is an erase flowchart of a conventional flash memory cell shown in FIG. 4.

An erase operation of the flash memory cell array constructed as above according to the preset invention will be below described in detail by reference to FIGS. 7 and 8.

As mentioned above, the conventional erase operation requires a pre-programming and pre-programming verification step, an erase and erase verification step, and a post-programming and post-programming verification step. On the contrary, an erase operation of the flash memory cell according to the present invention requires only an erase step S61 and an erase verification step S62, as can be seen from FIG. 7. This is because the capacitor 41 having a capacitance of a given amount (about 20 fF) is connected between the drain region 56 and the ground terminal Vss of the unit cell MC constituting the flash memory cell array of the present invention to in advance prevent over-erase generated upon an erase operation, so that the pre-programming and pre-programming verification step, and the post-programming and post-programming verification step are not necessary in the present invention.

In more detail, it is assumed that the unit cell MC of the present invention consists of a stack structure of a general stack gate where a source voltage Vs is applied to the source region 55, a drain voltage Vd is applied to the drain region 56, a gate voltage Vg is applied to the control gate 54, and a bulk voltage Vb is applied to the semiconductor substrate 50, as shown in FIG. 5.

Figure 8:
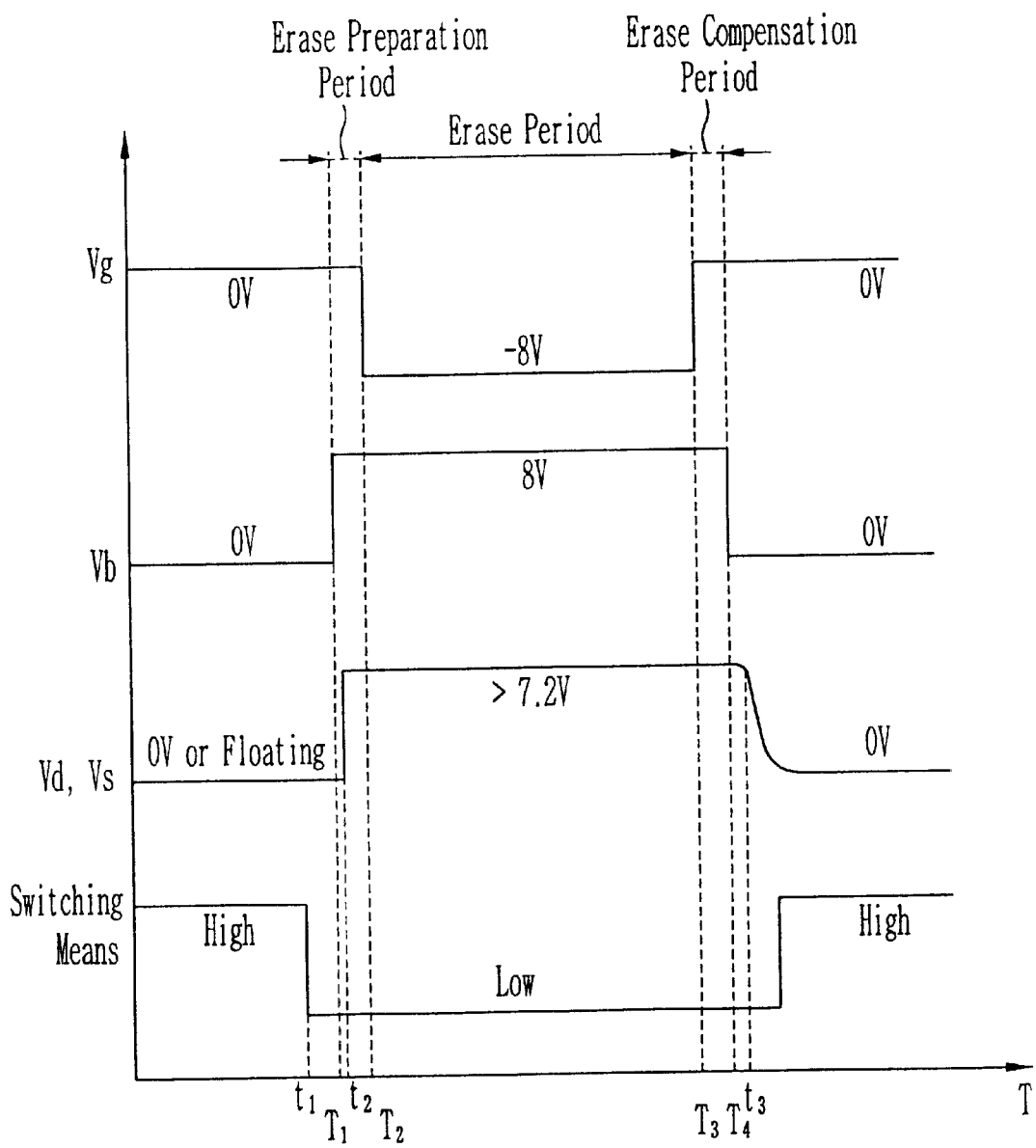
FIG. 8 is a timing chart of a memory cell erase pulse according to the erase flowchart shown in FIG. 7.

As shown in FIG. 8, during the period from T0 to T1, the switching means 40 (in case of PMOS) is inputted with a HIGH signal to maintain its OFF state. This allows the capacitor 41 not to affect other operation other than the erase operation by precluding a connection of the bit line B/L and the capacitor 41 at the time other than the erase operation since the capacitor 41 RC-delays the reading operation upon a reading operation of the cell MC. Meanwhile, a gate voltage Vg of 0V is applied to the control gate 54 through the word line W/L, a bulk voltage Vb of 0V is applied to the semiconductor substrate 50, and the source and drain regions 55 and 56 maintains a voltage of 0V or a floating state. Then, at time t1, as the switching means 40 is turned on, a current path is formed between the bit line B/L, the capacitor 41 and the ground terminal Vss.

A period from T1 to T2 is a prepare period to start the erase operation. The source and drain regions 55 and 56 are maintained to be at a floating state or 0V and a bulk voltage Vb of 8V is applied to the semiconductor substrate 50, so that the potential of the semiconductor substrate 50 starts to increase to the potential of the bulk voltage Vb. If the semiconductor substrate 50 starts to increase as much as the bulk voltage Vb, a positive (+) bias is applied between the semiconductor substrate 50 and the source region 55, and the semiconductor substrate 50 and the drain region 56, respectively, so that the bulk voltage Vb applied to the semiconductor substrate 50 is transmitted to the source region 55 and the drain region 56 to increase by at least over 7.2V (time t2). In this state, if a gate voltage Vg being a negative (−) bias voltage of about −8V is applied to the control gate 54 through the word line W/L, electrons within the floating gate 52 are discharged towards the source region 55, the drain region 56 or the semiconductor substrate 5 by the F-N tunneling effect through the tunnel oxide film 51 by means of the difference in the voltage between the floating gate 52 and the source and drain regions 55 and 56 or the semiconductor substrate 50, so that the erase operation starts.

Meanwhile, at time t1, the bit line B/L, as a current path is formed between the capacitor 41 and the ground terminal Vss, if the potential of the drain region 56 is increased at least by over 7.2V, the capacitor 41 starts to be charged with a given potential as the potential of the drain region 56 is transmitted through the bit line B/L.

A period from T2 to T3 is one that the erase operation is maintained. A gate voltage Vg of −8V is continuously applied to the control gate 54 through the word line W/L and a bulk voltage Vb of 8V is continuously applied to the semiconductor substrate 50 to maintain the source and drain regions 55 and 56 to be the potential of at least 7.2V, so that the erase operation is continuously performed. Then, if a gate voltage Vg of 0V is applied to the control gate 54 through the word line W/L (period T3), no further F-N tunneling effect is generated since the difference in the voltage between the control gate 54 and the source and drain regions 55 and 56 or the semiconductor substrate 50 is significantly reduced (from 18V to 8V), so that the erase operation is completed.

A period from T3 to T4 is an erase compensation period during which the state of the floating gate 52 is compensated for, when the floating gate 52 is over-erased or not erased (stat that erase is not completely performed) after the erase operation is finished (period T3). For example, the erase compensation period compensates for the case the threshold voltage is lowered since the floating gate 52 of the cell is over-erased by the erase operation to have a positive (+) voltage state in which the amount of holes is greater than that of electrons, or the case the threshold voltage is increased since the floating gate 52 of the cell is not erased by the erase operation to have a negative (+) voltage state in which the amount of electrons is greater than that of holes.

The erase compensation operation will be described in detail as follows. After the erase operation is completed (period T3), a bulk voltage Vb of 0V is applied to the semiconductor substrate 50, so that the potential of the source and drain regions 55 and 56 is maintained to be at least 7.2V (from T4 to t3 period) while the potential of the semiconductor substrate 50 is lowered to 0V (period T4). Due to this, as a reverse-bias is applied between the semiconductor substrate 50 and the source and drain regions 55 and 56, a BTBT (Band To Band Tunneling) current is generated by avalanche between the semiconductor substrate 50 and the source region 55 or the semiconductor substrate 50 and the drain region 56 to increase hot carriers in the channel region. At this time, if the floating gate 52 among the generated hot carriers has a negative (−) voltage state, holes are injected into the floating gate 52. On the other hands, if the floating gate 52 has a positive (+) voltage state, electrons are injected into the floating gate 52. In other words, if the floating gate 52 that is not erased has a program state in which the number of electrons is greater than that of holes, holes among the hot carriers are injected into the floating gate 52 to reduce the threshold voltage of the cell. On the other hands, if the floating gate 52 that is over-erased has an over-erase state in which the number of holes is greater than that of electrons, electrons among the hot carriers are injected into the floating gate 52 to increase the threshold voltage of the cell. This phenomenon can be further accelerated by the capacitor 41. This is because it functions to generate sufficient current so that a sufficient amount of hot carriers can be generated in the channel region, as the capacitor 41 previously charged in the previous period is discharged to the drain region 56 by a reverse bias.

Also, if the floating gate 52 is at a program state since the erase operation is not completed, it corresponds to a state that an over-voltage is applied to the tunnel oxide film 51. Thus, it rarely affects the erase speed of the cell since the amount of holes injected into the floating gate 52 by BTBT is very smaller than the amount of electrons exiting from the floating gate 52 by the F-N tunneling effect generated in this case. On the contrary, in a state that the floating gate 52 is sufficiently erased, as the amount of electrons exiting from the floating gate 52 by the F-N tunneling effect is very small, erase of the cell is stopped at a point where the amount of electrons injected into the floating gate 52 by BTBT and the amount of electrons exiting from the floating gate 52 are identical, so that over-erase is not performed.

As described in the above, the function of the capacitor formed between the bit line B/L and the ground terminal Vss will be below described by reference to FIG. 9.

Figure 9:
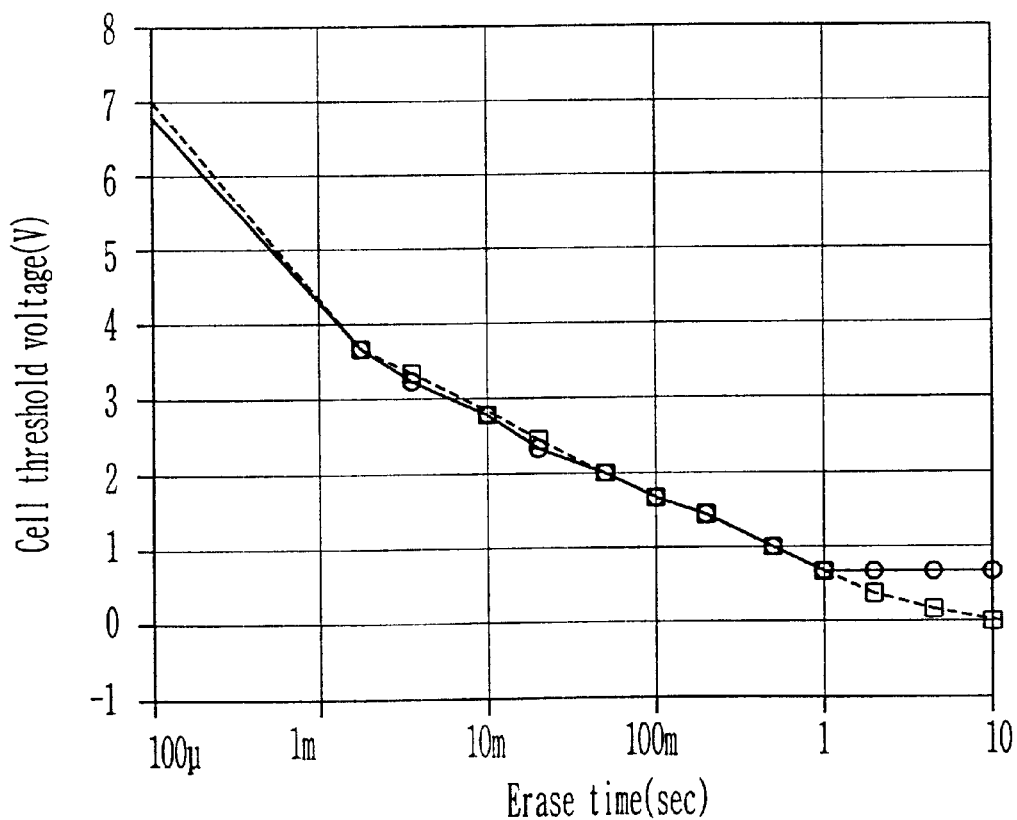
FIG. 9 shows an erase characteristic of the conventional flash memory cell and the flash memory cell of the present invention.

FIG. 9 shows a variation characteristic of the threshold voltage (V) of the cell against the erase time (sec) of the cell, which compares a case that the capacitor is formed between the bit line B/L and the ground terminal Vss of the cell (indicated by a solid line on the graph) and a case that the capacitor is not formed between the bit line B/L and the ground terminal Vss of the cell (indicated by a dotted line on the graph), and a case that the drain region of the cell is floated (- - -□- - -) and a case that the capacitor is connected to the drain region (—o—).

At this time, the erase condition of the cell is as follows: a gate voltage Vg applied to the control gate is −8V, a bulk voltage Vb applied to the semiconductor substrate is 8V and an erase pulse is 2 ms, provided that the capacitance of the capacitor is 20 fF.

Referring now to FIG. 9, it could be seen that, during the erase time (sec) from 100 μs to 1s, the threshold voltage (V) of the cell both in the case that the capacitor is formed between the bit line B/L and the ground terminal Vss of the cell (indicated by a solid line on the graph) and the case that the capacitor is not formed between the bit line B/L and the ground terminal Vss of the cell is decreased to about 0.7V. However, it could be seen that, from the time that the erase time (sec) passes through 1 s, the threshold voltage (V) of the cell in the case that the capacitor is not formed between the bit line B/L and the ground terminal Vss of the cell is decreased to below 0.7V, while the threshold voltage (V) of the cell in the case that the capacitor is formed between the bit line B/L and the ground terminal Vss of the cell is maintained to be constant at 0.7V. This phenomenon is same to the case that the drain region of the cell is floated and that the drain region is connected to the capacitor.

Therefore, in order to improve erase distribution of a conventional flash memory cell, the present invention uses a new soft program of a self-converging mode capable of preventing in advance over-erase and non-erase of the cell, by connecting a capacitor having a capacitance of about 20 fF between a bit line connected to a drain region and a ground terminal to further accelerate an increase of hot carriers in a diode reverse-bias state between the drain region and a semiconductor substrate upon an erase operation of the cell.

As can be understood from the above description, the present invention connects a capacitor of a given capacitance between a bit line connected to a drain region and a ground line within a flash cell array. Therefore, the present invention has an outstanding effect that it can accelerate an increase of hot carriers generated in a diode reverse-bias state between the drain region and a semiconductor substrate upon an erase operation of the cell to prevent over-erase or non-erase of the cell by means of hot carriers and thus solve an over-erase problem of the cell without requiring additional pre-programming and verification operation, and additional post-programming and verification operation, thus reducing the time and power consumption in the cell erase operation.

Further, the present invention can secure a high erase throughput with a rapid verification in a low-voltage flash memory device, by solving the over-erase problem without performing the pre-programming and verification operation and the post-programming and verification operation.

In addition, the self-converging erase concept proposed in the present invention can be applied to important technologies, etc. such as high-performance, low supply voltage and multi-level flash memory cell and the like, can improve the cell erase distribution, and can be widely used in a multi-level flash memory cell since it can secure a high erase throughput in a low-voltage flash memory cell.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device, comprising:
   a memory cell array in which a plurality of memory cells are each connected between a plurality of word lines and a plurality of bit lines;
   a plurality of switches each connected to said bit lines; and a capacitor connected between said switches and ground, wherein said capacitor includes a first electrode and a second electrode and said memory cell includes a control gate and a floating gate, wherein the first electrode is made of the control gate and the second electrode is made of the floating gate.

2. The flash memory device as claimed in claim 1, wherein each of said switches includes one of a PMOS transistor and a switchable semiconductor device that is turned on during an erase operation.

3. The flash memory device as claimed in claim 1, wherein said capacitor has a capacitance of 20 fF.

4. The flash memory device as claimed in claim 1, further comprising a plurality of switches connected between said bit lines and the ground and driven by an erase signal.

5. The flash memory device as claimed in claim 4, wherein said switches includes one of a PMOS transistor and a switchable semiconductor device that is turned on during an erase operation.

6. A method of erasing a flash memory cell including a floating gate and a control gate stacked on a semiconductor substrate, and source and drain formed in the semiconductor substrate on both sides of a floating gate, comprising the step of:

performing an erase operation as electrons injected into said floating gate are discharged through said semiconductor substrate, by applying respective erase bias voltages to said control gate, said source and drain, and said semiconductor substrate, wherein hot carriers are generated in said semiconductor substrate depending on an increase of current by a capacitance between the drain and the ground and the generated hot carriers are injected into said floating gate, thus preventing over-erase and non-erase.

7. The method as claimed in claim 6, wherein said capacitance is supplied by a capacitor having its first electrode formed of a control gate of said memory cell and its second electrode formed of a floating gate of said memory cell.

8. The method as claimed in claim 6, wherein upon said erase operation, if the floating gate has a voltage higher than an erase threshold voltage, the majority holes among the hot carriers are injected into the floating gate.

9. The method as claimed in claim 6, wherein upon said erase operation, if the floating gate has a voltage lower than an erase threshold voltage, the majority electrons among the hot carriers are injected into the floating gate.

* * * * *